(12) United States Patent
Legendre et al.

(10) Patent No.: US 11,782,076 B2
(45) Date of Patent: *Oct. 10, 2023

(54) ELECTRICAL DEVICE FOR RECEIVING A MAGNETIC FIELD MEASUREMENT SENSOR

(71) Applicant: Valeo Siemens eAutomotive France SAS, Cergy (FR)

(72) Inventors: Alexandre Legendre, Cergy (FR); Aurelien Pouilly, Cergy (FR)

(73) Assignee: Valeo Siemens eAutomotive France SAS, Cergy (FR)

( * ) Notice: Subject to any disclaimer, the term of this patent is extended or adjusted under 35 U.S.C. 154(b) by 8 days.

This patent is subject to a terminal disclaimer.

(21) Appl. No.: 17/533,547

(22) Filed: Nov. 23, 2021

(65) Prior Publication Data

US 2022/0163568 A1 May 26, 2022

(30) Foreign Application Priority Data

Nov. 26, 2020 (FR) ..................................... 2012201

(51) Int. Cl.
*G01R 15/14* (2006.01)
*G01R 19/00* (2006.01)

(52) U.S. Cl.
CPC ....... *G01R 15/148* (2013.01); *G01R 19/0092* (2013.01)

(58) Field of Classification Search
CPC ...... G01R 15/207; G01R 15/18; G01R 33/06; G01R 33/0047; G01R 33/072; G01R 33/091
See application file for complete search history.

(56) References Cited

U.S. PATENT DOCUMENTS 6,545,456 B1 4/2003 Radosevich et al.
2002/0050915 A1 5/2002 Riehl et al.
(Continued)

FOREIGN PATENT DOCUMENTS

JP 2935409 B2 8/1999

OTHER PUBLICATIONS

European Search Report in corresponding European Application No. 21208679.7, dated Apr. 12, 2022 (8 pages).

*Primary Examiner* — Dominic E Hawkins
(74) *Attorney, Agent, or Firm* — Osha Bergman Watanabe & Burton LLP

(57) ABSTRACT

The invention relates to an electrical device comprising a support comprising a holding member, and an electrical circuit (12) housed at least partially in the support and comprising an array of electrical tracks (122) and a receiving portion (121) designed to receive a magnetic field sensor. The electrical circuit (12) is configured so as to create an electrical link between the magnetic field sensor, on the one hand, and an electronic board external to the electrical device, on the other hand. The holding member comprises at least one bearing portion forming a stop so as to create a mechanical link between the support and the electronic board. Said receiving portion (121) forms an exposed surface configured so as to create an electrical connection with said magnetic field sensor through plane-to-plane contact between the receiving portion (121) and a face of the magnetic field sensor.

10 Claims, 3 Drawing Sheets

(56) References Cited

U.S. PATENT DOCUMENTS

| | | |
|---|---|---|
| 2006/0176047 A1* | 8/2006 | Lepine ................. G01R 15/207 |
| | | 324/117 R |
| 2007/0120552 A1 | 5/2007 | Kaneda |
| 2012/0001627 A1* | 1/2012 | Flock ................. G01R 33/0047 |
| | | 324/252 |
| 2015/0070006 A1* | 3/2015 | Turpin ................. G01R 15/207 |
| | | 324/244 |
| 2017/0003325 A1 | 1/2017 | Simonin |
| 2018/0011129 A1* | 1/2018 | Houbre ................ G01R 15/181 |
| 2018/0128860 A1 | 5/2018 | Kaisha |
| 2018/0331525 A1* | 11/2018 | Fukuhara ................. H05K 5/02 |

\* cited by examiner

ELECTRICAL DEVICE FOR RECEIVING A MAGNETIC FIELD MEASUREMENT SENSOR

TECHNICAL FIELD

The present invention relates to the field of the monitoring of electrical systems, notably for vehicles, in particular for electric or hybrid vehicles. More precisely, the present invention targets an electrical device for measuring current for the purpose of monitoring an electrical system.

As is known, an electric or hybrid motor vehicle comprises an electric motorization system supplied with power by a high-voltage supply battery via a high-voltage on-board electrical system. The high-voltage supply battery performs a function of supplying energy to the electric motorization system in order to propel the vehicle. More precisely, in order to control the electric machine driving the wheels of the vehicle, it is known to use an inverter for converting the DC current supplied by the high-voltage supply battery into one or more for example sinusoidal AC control currents.

To this end, the inverter comprises electrical components that are passed through by the energy supplied to the electric machine, and also an electronic monitoring unit comprising electronic components for monitoring the electrical components of the inverter. The electrical components of the inverter may be arranged in a power electronics module.

The inverter also comprises electrical conductors, in particular three of them in three-phase mode, which are connected to the phases of the electric machine, or in general in a number that is a multiple of three if the inverter supplies power to a plurality of three-phase electric machines. Each electrical conductor of the electrical system under consideration, also referred to as a "leadframe" as it is known to a person skilled in the art, is connected to a phase connector of the electric machine.

As is known, in order to monitor the operation of an electrical system monitoring an electric machine, such as an inverter monitoring the electric machine, it is necessary to know the current flowing in each phase of the electric machine in order to appropriately control the inverter supplying electrical energy to said electric machine.

To this end, it is known to perform a current measurement in an electrical conductor of the electrical system under consideration. In general, in the context of a three-phase inverter, it is sufficient to perform the current measurements in two of the three electrical conductors, the current flowing in the third conductor being able to be determined from the currents flowing in the other two conductors. This current measurement generally involves a magnetic field measurement. A sensor measuring the magnetic field is therefore arranged so as to measure the magnetic field induced by the current in a corresponding electrical conductor of the electrical system. The value of each magnetic field is then used to determine the strength of the current.

Typically, the sensor measuring the magnetic field is mounted on an electronic board that will deliver the value of the current on the basis of the measurement performed by the sensor measuring the magnetic field. The sensor is generally at a distance from the electronic board so as to be as close as possible to the electrical conductor, and is connected to said electronic board by pins. However, this electrical connection between the sensor and the electronic board may be fragile, for example due to mechanical constraints exerted on the pins and/or at the junction between the pins and the sensor. There is therefore a need for a means for electrical connection between the sensor and the electronic board that allows improved mechanical holding.

To this end, the invention proposes an electrical device for receiving a sensor for a magnetic field measurement.

PRESENTATION OF THE INVENTION

More precisely, the invention relates to an electrical device, intended notably to be housed on board an electric or hybrid motor vehicle, comprising a support and an electrical circuit housed at least partially in the support, the support comprising a holding member. The invention makes it possible notably to measure a current flowing in an electrical conductor of an electrical system for the purpose of monitoring said electrical system, in particular an item of power electronics equipment.

The electrical circuit comprises an array of electrical tracks and a receiving portion designed to receive a magnetic field sensor, said receiving portion being at a distance from the holding member, notably at a distal end of the support with respect to the holding member. The electrical circuit is configured so as to create an electrical link between the magnetic field sensor, on the one hand, and an electronic board external to the electrical device, on the other hand, by way of the receiving portion and the array of electrical tracks.

In addition, the holding member comprises at least one bearing portion forming a stop for creating a mechanical link between the support and the electronic board.

Said receiving portion forms an exposed surface configured so as to create an electrical connection with said magnetic field sensor through plane-to-plane contact between the receiving portion and a face of the magnetic field sensor.

The present invention has the substantial advantage of making it possible to use a magnetic field sensor without any pins, thus improving the mechanical strength of the assembly formed by the electrical device and the magnetic field sensor.

Advantageously, the support comprises a reception portion for positioning the magnetic field sensor in relation to the support, the reception portion and the holding member being configured so as to make it possible to install the electrical device with respect to the electrical conductor so as to reduce a positioning uncertainty between the magnetic field sensor and the electrical conductor.

Advantageously, said at least one bearing portion of the holding member has a bearing surface configured so as to bear against the electronic board.

Advantageously, the support is overmoulded on the electrical circuit, the support and the electrical circuit forming an overmoulded assembly. The positioning uncertainty between the magnetic field sensor and the electrical conductor is thus reduced, thereby making it possible to improve the precision of the current measurements.

Advantageously, the support consists of plastic.

Advantageously, the electrical circuit comprises connecting feet that are configured so as to be electrically connected to the electronic board.

The invention also relates to an electrical magnetic field measurement assembly comprising a magnetic field sensor and an electrical device according to the invention.

The invention also relates to an electrical assembly that comprises the electrical magnetic field measurement assembly according to the invention, an electronic board, and an electrical conductor, the electrical magnetic field measurement assembly firstly being applied to the electronic board and secondly immersing the magnetic field sensor in a free volume formed in the electrical conductor so as to measure a magnetic field induced by a current flowing in the electrical conductor.

The invention furthermore relates to an electrical assembly that comprises the electrical magnetic field measurement assembly according to the invention, an electronic board, and an electrical conductor, the electrical magnetic field measurement assembly firstly being applied to the electronic board and secondly positioning the magnetic field sensor at a distance from a surface of the electrical conductor, so as to measure a magnetic field induced by a current flowing in the electrical conductor, said distance being greater than or equal to 0 and less than or equal to 1.5 mm. In particular, said distance may be less than 1 mm, or even than 0.5 mm.

Advantageously, the electrical assemblies according to the invention do not have a magnetic field concentrator. The compactness of the electrical assembly is thus improved.

The invention furthermore relates to an item of power electronics equipment that comprises an electronic board, a number of electrical conductors, and a number of electrical magnetic field measurement assemblies according to the invention, each of the electrical magnetic field measurement assemblies being paired with one of the electrical conductors so as to perform measurements of a magnetic field induced by a current flowing in the corresponding electrical conductor.

The receiving portion notably forms a plate, in particular an electrically conductive plate. In particular, the receiving portion and the sensor extend primarily along one and the same direction so as to form the plane-to-plane contact.

PRESENTATION OF THE FIGURES

The invention will be better understood upon reading the following description, given by way of example, and with reference to the following figures, which are given by way of non-limiting example and in which identical references are given to similar objects.

It should be noted that the figures explain the invention in detail in order to implement the invention, said figures of course being able to serve to better define the invention where applicable.

DETAILED DESCRIPTION OF THE INVENTION

The invention relates to an electrical device, in particular for current measurements for the purpose of monitoring an electrical system, notably configured so as to be housed on board an electric or hybrid motor vehicle. The invention will be described below in the context of measuring a current flowing in an electrical conductor of the electrical system. Such an electrical conductor is commonly referred to as a "leadframe". The electrical system may be an item of power electronics equipment, notably an inverter or a DC-to-DC voltage converter.

Figure 1:
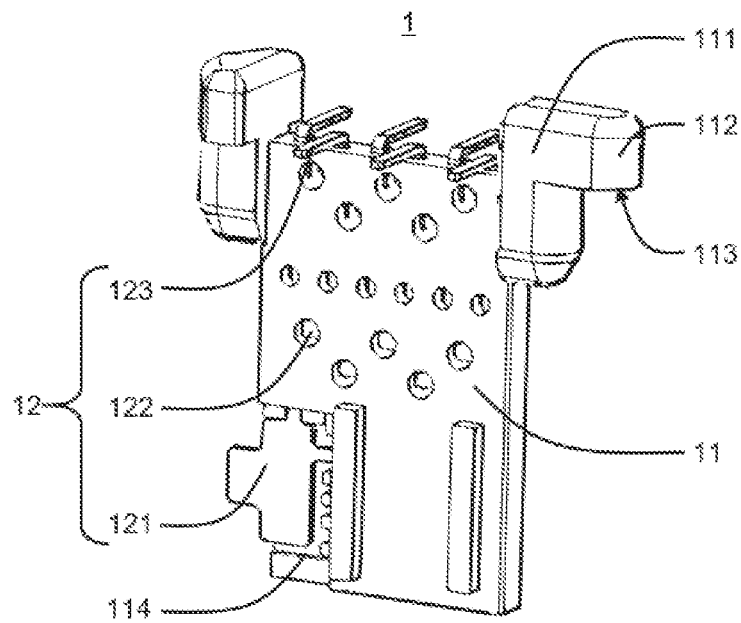
FIG. 1 shows a view of the electrical device according to one example of the invention.

With reference to FIG. 1, the electrical device 1 according to the invention comprises a support 11 and an electrical circuit 12 housed at least partially in the support 11. In other words, the support 11 holds the electrical circuit 12.

Figure 2:
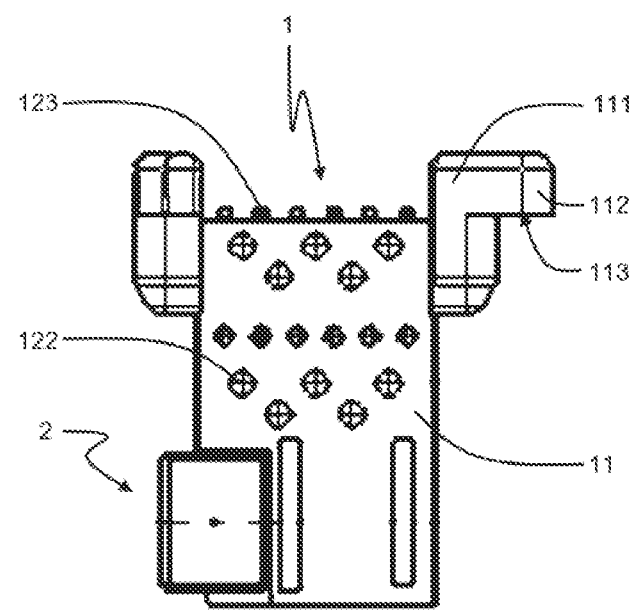
FIG. 2 shows a front-on view of an electrical magnetic field measurement assembly comprising the electrical device according to one example of the invention and a magnetic field sensor.
Figure 3:
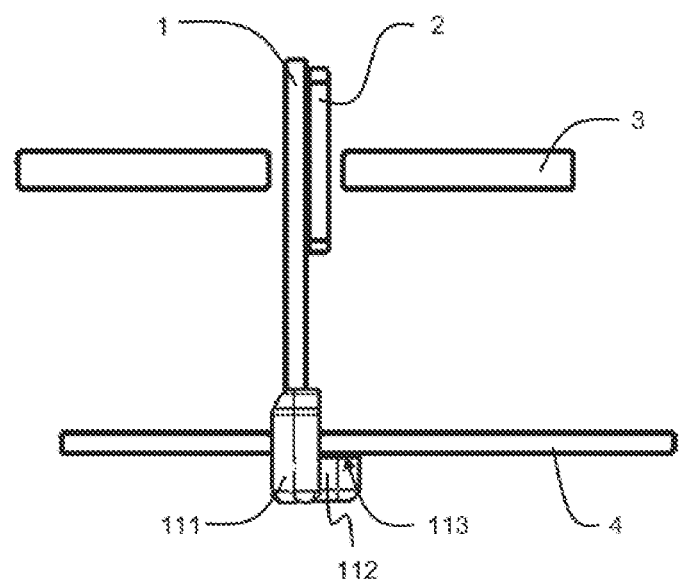
FIG. 3 shows a side-on view of one example of an electrical assembly according to a first embodiment of the invention comprising an electronic board, an electrical conductor, and an electrical magnetic field measurement assembly comprising the electrical device according to one example of the invention and a magnetic field sensor.
Figure 4:
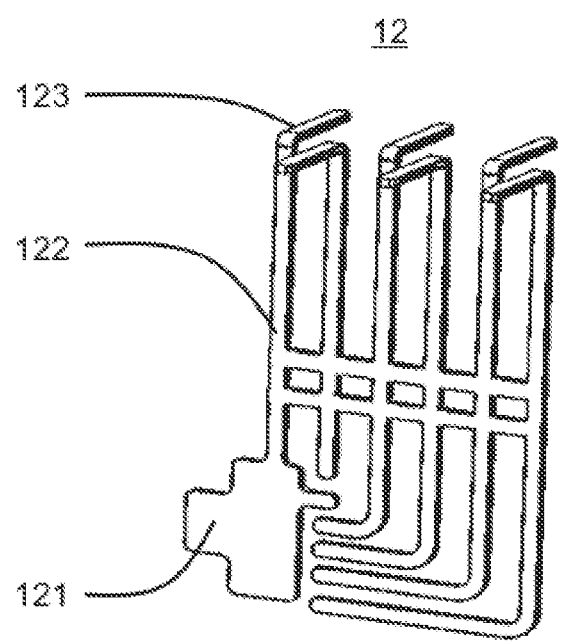
FIG. 4 shows a view of an electrical circuit of the electrical device according to one example of the invention.

In addition, with reference to FIGS. 1 and 4, the electrical circuit 12 comprises an array of electrical tracks 122 and a receiving portion 121 designed to receive a magnetic field sensor 2 that is shown in FIGS. 2 and 3. In particular, the magnetic field sensor 2 may consist of a Hall sensor, of a giant magnetoresistor, or of any other magnetic field measurement device, provided that the magnetic field sensor does not have any pins and is configured so as to perform magnetic field measurements in order to deduce the current measurement therefrom. Using such a magnetic field sensor 2 makes it possible to notably improve the mechanical strength of the electrical system.

As illustrated in FIG. 3, the electrical circuit 12 is configured so as to create an electrical link between the magnetic field sensor 2, on the one hand, and an electronic board 4 external to the electrical device 1, on the other hand, by way of the receiving portion 121 and the array of electrical tracks 122. In other words, the magnetic field sensor 2 transmits the magnetic field measurements to the electronic board 4 by way of the receiving portion 121 and then the array of electrical tracks 122. The electronic board 4 makes it possible notably to control operations of monitoring the electrical system based on the magnetic field measurements.

In addition, with reference to FIGS. 1 to 3, the support comprises a holding member 111 comprising at least one bearing portion 112 forming a stop so as to create a mechanical link between the support 11 and the electronic board. The receiving portion 121 is then at a distance from the holding member 111, more particularly at a distal end of the support 11 with respect to the holding member 111. The magnetic field sensor 2 thus makes it possible to measure a current flowing in a conductor 3 that is at a distance from the electronic board 4 on which the support 11 is mounted.

In addition, said receiving portion 121 forms an exposed surface configured so as to create an electrical connection with said magnetic field sensor 2 through plane-to-plane contact between the receiving portion 121 and a face of the magnetic field sensor 2.

The support 11 makes it possible to position the electrical device 1 in relation firstly to the electrical conductor 3 and secondly to the electronic board 4 so as to position the magnetic field sensor 2 with respect to the electrical conductor 3. The magnetic field sensor 2 is then able to perform measurements of a magnetic field induced by a current flowing in the electrical conductor 3. In addition, the electrical device 1 is notably configured so as to transmit said magnetic field measurements to the electronic board 4 for the purpose of monitoring the electrical system.

The support 11 preferably comprises an opening formed opposite the receiving portion 121 so as to allow the magnetic field sensor 2 to be fastened on the receiving portion 121.

The support 11 moreover preferably comprises a reception portion 114 for positioning the magnetic field sensor 2 in relation to the support 11. The periphery of the opening formed opposite the receiving portion 121 may form the reception portion 114, as illustrated in FIG. 1. The reception portion 114 then performs the function of a chock so as to allow precise positioning of the magnetic field sensor 2 in relation to the support 11.

In addition, said at least one bearing portion 112 is preferably formed of two bearing portions located, respectively, at two opposing ends of the support 11 so as to improve holding between the support 11 and the electronic board 4 and to ensure precise positioning thereof.

With reference to FIGS. 1 to 3, said at least one bearing portion 112 has a bearing surface 113 configured so as to bear against the electronic board 4. The mechanical link between the support 11 and the electronic board 4 then comprises this bearing.

The reception portion 114 and the holding member 111 are notably configured so as to make it possible to install the electrical device 1 with respect to the electrical conductor 3. It is thus possible to ensure a precise and controlled positioning uncertainty between the magnetic field sensor 2 and the electrical conductor 3, notably in the direction of an axis linking the magnetic field sensor 2 to the electronic board 4 on which the electrical device 1 is mounted.

The electrical device 1 may preferably have a rigidity that is suitable for reducing any vibrations of the magnetic field sensor 2.

In addition, the electrical device 1 may comprise fastening means for assembling the electrical device 1 and the electronic board 4.

The support 11 is preferably overmoulded on the electrical circuit 12. The support 11 and the electrical circuit 12 thus form an overmoulded assembly.

Such an overmoulded assembly, comprising the holding member 111 and the reception portion 114, makes it possible to ensure positioning between the magnetic field sensor 2 and the electrical conductor 3 with a reduced positioning uncertainty. The positioning uncertainty depends mainly on the uncertainty of the overmoulding process; for example the positioning uncertainty may be of the order of +/−0.4 mm. Reducing the positioning uncertainty makes it possible to considerably improve the precision of the current measurements, in particular by a factor of 30%. Using an overmoulded assembly therefore makes it possible to improve the precision of the current measurements by the magnetic field sensor 2, notably by reducing the number of physically independent elements required for the relative positioning of the magnetic field sensor 2 with respect to the electrical conductor 3.

The support 11 preferably consists of plastic, notably compatible with an overmoulding manufacturing process.

With reference to FIG. 4, the electrical circuit 12 may advantageously comprise connecting feet 123 that are configured so as to be electrically connected to the electronic board 4. The connecting feet 123 allow simplified connection of the electrical device 1 to the electronic board 4.

In addition, the array of electrical tracks 122 is preferably routed so as to electrically connect the magnetic field sensor 2 notably to the electronic board 4. In the context of the overmoulded assembly as described above, it is common and advantageous to perform the routing operation after the overmoulding. As a result, it may be useful to provide openings formed in the support 11 of the overmoulded assembly. These openings are in particular opposite portions of the array of electrical tracks 122 that are to be perforated, so as to be able to perform the routing after the overmoulding.

The electrical circuit 12 preferably consists of an electrically conductive material, in particular a material comprising copper.

According to one aspect of the invention, an electrical magnetic field measurement assembly comprises the magnetic field sensor 2 and the electrical device 1.

A process of manufacturing the electrical magnetic field measurement assembly may furthermore comprise:
- a step of stamping followed by a step of bending a sheet of electrically conductive material so as to form the electrical circuit 12, the electrical circuit 12 not necessarily being correctly routed;
- a step of overmoulding the electrical circuit 12 with the support 11;
- a step of punching in order to route the array of electrical tracks 122 of the electrical circuit 12,
- a step of soldering the magnetic field sensor 2 to the receiving portion 121.

According to a first embodiment of an electrical assembly according to the invention, with reference to FIG. 3, the electrical assembly comprises the electrical magnetic field measurement assembly, an electronic board 4, and an electrical conductor 3. In this first embodiment, the electrical magnetic field measurement assembly firstly is applied to the electronic board 4 and secondly immerses the magnetic field sensor 2, notably vertically, in a free volume formed in the electrical conductor 3 so as to measure a magnetic field induced by a current flowing through the electrical conductor 3. The free volume is preferably open. The free volume is notably suitable for obtaining optimum precision of the magnetic field measurements.

Figure 5:
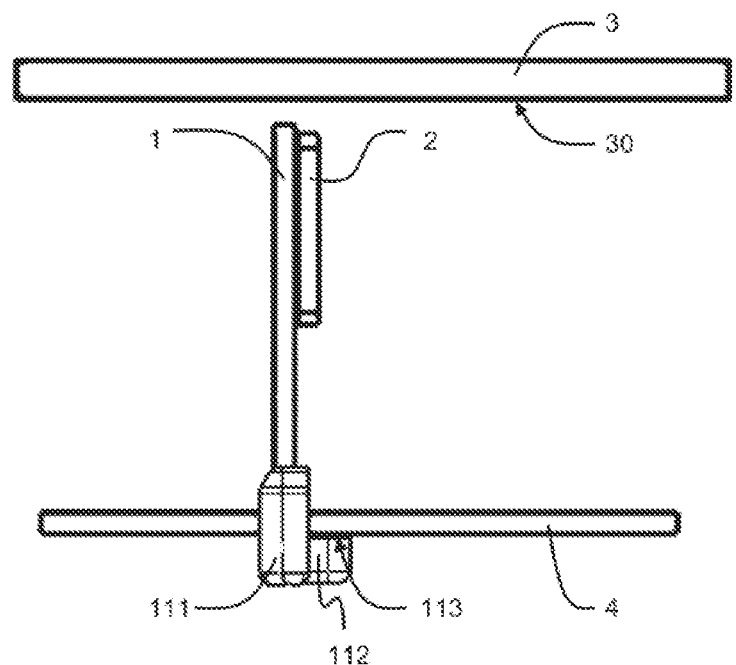
FIG. 5 shows a side-on view of one example of an electrical assembly according to a second embodiment of the invention comprising an electronic board, an electrical conductor, and an electrical magnetic field measurement assembly comprising the electrical device according to one example of the invention and a magnetic field sensor.

According to a second embodiment of an electrical assembly according to the invention, with reference to FIG. 5, the electrical assembly comprises the electrical magnetic field measurement assembly, an electronic board 4, and an electrical conductor 3. In this second embodiment, the electrical magnetic field measurement assembly firstly is applied to the electronic board 4 and secondly positions the magnetic field sensor 2 at a distance from a surface 30 of the electrical conductor 3 so as to measure a magnetic field induced by a current flowing in the electrical conductor 3. The distance is preferably less than 1.5 mm, or even than 1 mm, or even than 0.5 mm. The distance may even be zero. In this case, the magnetic field sensor 2 may touch the surface 30 of the electrical conductor 3. The distance may notably have a value equal to a positioning uncertainty of the magnetic field sensor 2 with respect to the electrical conductor 3.

In addition, according to the first and second embodiments of the electrical assembly according to the invention, the electrical assembly preferably does not have a magnetic field concentrator, allowing a gain in compactness.

According to one aspect of the invention, an item of power electronics equipment comprises an electronic board, a number of electrical conductors, and a number of electrical magnetic field measurement assemblies. Each of the electrical magnetic field measurement assemblies is paired with one of the electrical conductors so as to perform measurements of a magnetic field induced by a current flowing in the corresponding electrical conductor. It may be noted that the number of electrical conductors is not necessarily equal to the number of electrical magnetic field measurement assemblies. Indeed, a number of electrical magnetic field measurement assemblies less than the number of electrical conductors may be sufficient, the rest of the current values being able to be deduced from the measurements performed by the electrical magnetic field measurement assemblies.

The item of power electronics equipment may notably be an inverter. The number of electrical conductors corresponds notably to the number of AC phases of the inverter, generally equal to three. In particular, the number of electrical magnetic field measurement assemblies may be equal to two. The two electrical magnetic field measurement assemblies are then configured so as to perform current measurements in two of the three electrical conductors, the current in the third electrical conductor being able to be deduced from the current measurements from the other two electrical conductors.

As an alternative, the item of power electronics equipment may notably be a DC-to-DC voltage converter, in particular a DC-to-DC voltage converter at the input of the high-voltage battery.

To sum up, by virtue of the receiving portion of the electrical device, the present invention has the substantial advantage of making it possible to use a magnetic field sensor without any pins, improving the mechanical strength of the electrical assembly.

In addition, the present invention makes it possible to perform magnetic field measurements on an electrical conductor in situ or close to the electrical conductor, not requiring any magnetic field concentrator. The compactness of the items of power electronics equipment is thus improved.

By virtue of using an overmoulded assembly, the present invention has the considerable advantage of guaranteeing a controlled and precise positioning uncertainty, leading to an improvement in the precision of the magnetic field measurements and therefore in the precision of the current measurements. Precise current measurements make it possible to improve current monitoring, notably at the input and/or at the output of an inverter, or of a DC-to-DC voltage converter, and thus to improve the service life of electrical components.

In addition, the overmoulded assembly advantageously makes it possible to ensure improved repeatability of the implementation of the electrical magnetic field measurement assembly, therefore leading to improved repeatability of the current measurements.

Furthermore, from an industrial manufacture point of view, the configuration of the overmoulded assembly makes it possible to use the overmoulding manufacturing process, which is a well-controlled and inexpensive process.

The present invention also has the advantage of making it easier to size the electrical device, this being able to be modulated. The electrical device according to the invention is able to be connected to various configurations of the electrical system.

The invention claimed is:

1. An electrical device housed on board an electric or hybrid motor vehicle, comprising:
    a support comprising a holding member; and
    an electrical circuit housed at least partially in the support and comprising an array of electrical tracks and a receiving portion configured to receive a magnetic field sensor, said receiving portion being at a distance from the holding member, at a distal end of the support with respect to the holding member,
    the electrical circuit being configured so as to create an electrical link between the magnetic field sensor, and an electronic board external to the electrical device by way of the receiving portion and the array of electrical tracks,
    the holding member comprising at least one bearing portion forming a stop so as to create a mechanical link between the support and the electronic board, and
    said receiving portion forming an exposed surface configured so as to create an electrical connection with said magnetic field sensor through plane-to-plane contact between the receiving portion and a face of the magnetic field sensor.

2. The electrical device according to claim 1, wherein the support comprises a reception portion for positioning the magnetic field sensor in relation to the support, the reception portion and holding member being configured so as to allow the electrical device to be installed with respect to an electrical conductor so as to reduce a positioning uncertainty between the magnetic.

3. The electrical device according to claim 1, wherein said at least one bearing portion of the holding member has a bearing surface configured so as to bear against the electronic board.

4. The electrical device according to claim 1, wherein the support is overmoulded on the electrical circuit, the support and the electrical circuit forming an overmoulded assembly.

5. The electrical device according to claim 1, wherein the support consists of plastic.

6. The electrical device according to claim 1, wherein the electrical circuit comprises connecting feet that are configured so as to be electrically connected to the electronic board.

7. An electrical magnetic field measurement assembly comprising: the magnetic field sensor; and the electrical device according to claim 1.

8. An electrical assembly comprising:
    the electrical magnetic field measurement assembly according to claim 7;
    the electronic board; and
    an electrical conductor,
    the electrical magnetic field measurement assembly firstly being applied to the electronic board and secondly, immersing the magnetic field sensor in a free volume formed in the electrical conductor so as to measure a magnetic field induced by a current flowing in the electrical conductor.

9. An electrical assembly comprising:
    the electrical magnetic field measurement assembly according to claim 7;
    the electronic board; and
    an electrical conductor,
    the electrical magnetic field measurement assembly firstly being applied to the electronic board and secondly, positioning the magnetic field sensor at a distance from a surface of the electrical conductor so as to measure a magnetic field induced by a current flowing in the electrical conductor, said distance being greater than or equal to 0 and less than or equal to 1.5 mm.

10. The electrical assembly according to claim 9, not having a magnetic field concentrator.

* * * * *